United States Patent [19]
Diep-Quang

[11] Patent Number: 5,904,782
[45] Date of Patent: May 18, 1999

[54] EPOXY BASED, VOC-FREE SOLDERING FLUX

[75] Inventor: Hiep Diep-Quang, Jersey City, N.J.

[73] Assignee: Fry Metals, Inc., Jersey City, N.J.

[21] Appl. No.: 08/785,699

[22] Filed: Jan. 17, 1997

Related U.S. Application Data

[63] Continuation of application No. 08/448,683, May 24, 1995, abandoned.

[51] Int. Cl.$^6$ ..................................................... B23K 35/34
[52] U.S. Cl. ................................ 148/23; 148/24; 148/25
[58] Field of Search ................................ 148/23, 24, 25; 428/558, 560; 403/272

[56] References Cited

U.S. PATENT DOCUMENTS

| | | | |
|---|---|---|---|
| 3,791,027 | 2/1974 | Angelo | 148/23 |
| 3,923,571 | 12/1975 | Aoki et al. | 156/94 |
| 3,977,916 | 8/1976 | Stayner et al. | 148/23 |
| 4,360,144 | 11/1982 | Cuddy et al. | 148/23 |
| 4,420,512 | 12/1983 | Ogawa et al. | 427/386 |
| 4,487,638 | 12/1984 | Hoge | 148/24 |
| 4,532,273 | 7/1985 | Kadowaki et al. | 523/402 |
| 4,619,715 | 10/1986 | Hwang | 148/23 |
| 4,701,481 | 10/1987 | Bogan et al. | 523/428 |
| 4,794,149 | 12/1988 | Dervan et al. | 525/450 |
| 4,982,892 | 1/1991 | Parla et al. | 228/180.1 |
| 4,985,107 | 1/1991 | Conroy et al. | 156/299 |
| 4,988,395 | 1/1991 | Taguchi et al. | 148/24 |
| 4,994,326 | 2/1991 | Shimmura et al. | 428/405 |
| 5,088,189 | 2/1992 | Brown | 29/840 |
| 5,127,968 | 7/1992 | Gomi et al. | 148/23 |
| 5,128,746 | 7/1992 | Pennisi et al. | 357/72 |
| 5,145,722 | 9/1992 | Kaspaul | 427/388.1 |
| 5,167,729 | 12/1992 | Takemoto et al. | 148/23 |
| 5,176,759 | 1/1993 | Taguchi | 148/24 |
| 5,211,763 | 5/1993 | Takemoto | 148/24 |
| 5,215,601 | 6/1993 | Gomi et al. | 148/23 |
| 5,417,771 | 5/1995 | Arita | 148/24 |

FOREIGN PATENT DOCUMENTS

| | | |
|---|---|---|
| 0 413 312 A1 | 2/1991 | European Pat. Off. . |
| 0 443 030 A1 | 8/1991 | European Pat. Off. . |
| 42 35 575 A1 | 4/1994 | Germany . |
| 2-104494 | 4/1990 | Japan . |
| 5-8085 | 11/1991 | Japan . |
| 922596 | 4/1963 | United Kingdom . |

*Primary Examiner*—David A. Simmons
*Assistant Examiner*—Robert R. Koehler
*Attorney, Agent, or Firm*—Mintz, Levin, Cohn, Ferris, Glovsky and Popeo, P. C.

[57] ABSTRACT

A resin-based VOC-free soldering flux consists of 40 to 50 wt % of a liquid epoxy resin, 25 to 30 wt % of a non-volatile liquid epoxy diluent, 20 to 33 wt % of a polyfunctional carboxylic acid, and 2.0 to 3.5 wt % of a thixotropic agent. There are no volatile organic solvents or compounds in the flux which can evaporate during the reflow process. The carboxylic acids are provided in powdered form and are suspended in the epoxy blend wherein they remain as solid particles until heated in the solder reflow process. A VOC-free solder paste formed from the flux consists of 40 to 95 wt % soldering particles, and 5 to 60 wt % of the VOC-free soldering flux. The thixotropic agent improves printability of the solder paste onto printed wiring boards. A VOC-free flux-core solder wire includes the VOC-free flux as the inner core of the wire with an outer shell of solder alloy. The VOC-free, epoxy resin based flux effectively activates the solder powder and the copper contact during the reflow process, while at the same time hardens to leave a solid, dry, yet flexible residue on a printed wiring board. No organic compounds are emitted during the reflow process.

25 Claims, No Drawings

EPOXY BASED, VOC-FREE SOLDERING FLUX

This application is a continuation of application Ser. No. 08/448,683, filed May 24, 1995, abandoned.

BACKGROUND AND SUMMARY OF THE INVENTION

The instant invention relates to soldering fluxes and solder pastes, and more particularly to an epoxy-based soldering flux which does not contain any volatile organic compounds or solvents (VOC's).

Soldering fluxes and solder pastes have heretofore been known in the art. In this regard, solder pastes are used to connect the leads of electronic elements to contact pads on a printed wiring board (PWB). In use, solder pastes are printed onto the copper contact pads of the PWB, the leads of the electronic element are placed in proper position on top of the PWB contact pads, and then the entire PWB assembly is heated to achieve reflow of the solder paste to form a connection between the leads of the electronic element and the contact pads of the PWB.

Solder paste, in general, comprises a homogenized mixture of solder powder and a soldering flux which, when mixed with the solder powder, gives the mixture the physical characteristics of a paste. The soldering flux is typically a solution of a resin, usually a rosin or rosin derivative, and an organic acid activator dissolved in a volatile organic solvent. The organic solvent typically comprises up to 80 wt % (percent by weight) of the flux composition. The organic acid activator in the soldering flux actively removes an oxide film from the metallic components when applied to the metal surfaces thereof, thus allowing the melted solder to flow freely over and bind to all fluxed surfaces. Thixotropic agents and other viscosity modifiers can also be present to achieve the desired rheological characteristics of the soldering flux and/or solder paste.

During the reflow, i.e. heating, process, most of the organic solvent evaporates into the air leaving a solid residue on the PWB. Furthermore, besides the evaporation of the organic solvents, a significant amount additional of organic material becomes airborne as fume through decomposition or sublimation of the solid residue. While the prior art solder pastes and fluxes have been highly effective for their intended purposes, the evaporation of the organic solvent and release of organic materials during solder reflow pose many problems which have recently become a significant concern in the industry. Firstly, volatile organic compounds (VOC's) and VOC emissions are now receiving stricter scrutiny from an environmental perspective. More stringent environmental regulations are requiring the reduction of organic emissions in all industrial applications. Secondly, VOC emissions are a burden to the reflow equipment in that the VOC's recondense onto the cold parts of the equipment, corroding metal, causing electrical failure, and clogging ventilation ducts. Another disadvantage to organic solvent based solder pastes is that in the case of rosin type pastes, the solid residue is brittle, and prone to cracking. Many manufacturers of printed wiring boards are now producing flexible circuit structures, i.e. flexi-circuits, and the brittleness and cracking of solvent based solder pastes is unacceptable in these types of applications. The use of plasticizers to remedy the brittleness of rosin-type organic solvent solder pastes makes the organic residue sticky, and unsuitable for pin-testing of the PWB after reflow.

The instant invention provides an epoxy-based, VOC-free soldering flux comprising 40 to 50 wt % (percent by weight) of epoxy resin, 25 to 30 wt % of non-volatile liquid epoxy diluent, 20 to 33 wt % of an activating agent which is insoluble, i.e. unreactive, in the epoxy system at room temperature, and 2.0 to 3.5 wt % of a thixotropic agent. In the instant soldering flux, the activating agent also serves as a curing agent for the epoxy resin system. There are no organic solvents in the soldering flux which can evaporate during the reflow process. The epoxy diluent can be either a reactive diluent containing one or more epoxy functional groups, such as polyglycol diepoxide, or a non-reactive diluent, such as a polyether diol. More specifically, the soldering flux preferably comprises 40 to 50 wt % of bisphenol A type epoxy resin, 25 to 35 wt % polyglycol diepoxide (epoxy diluent), 20 to 35 wt % of a polyfunctional carboxylic acid (activating agent and curing agent), such as malic acid, and 2.0 to 3.5 wt % of hydrogenated castor oil (thixotropic agent).

The instant invention further provides a VOC-free solder paste formed from the above-described flux consisting of 40 to 95 wt % soldering particles, and 5 to 60 wt % of the above-described VOC-free soldering flux. The soldering particles preferably comprise 63Sn/37Pb alloy solder particles having mesh size of about 325 to 500. The thixotropic agent added to the flux composition improves printability of the solder paste onto printed wiring boards. The activating agent of the flux effectively activates the solder powder and the copper contact during the reflow process, while at the same time cures the epoxy so that it hardens to leave a solid, dry, yet flexible residue on a printed wiring board. The activating/curing agent is selected so that its melts just prior to the reflow process so that activation, curing of the resin, and reflow of the solder particles occur almost simultaneously.

The instant invention still further provides a flux-core solder wire formed from the above-described VOC-free soldering flux. The flux-core solder wire is formed according to conventional solder wire forming techniques resulting in a wire structure having an inner core of the instant VOC-free soldering flux, and an outer shell of a solder alloy.

Accordingly, among the objects of the instant invention are the provision of an epoxy-based VOC-free soldering flux which hardens after the reflow process to form a solid, dry, flexible residue on the printed wiring board; the provision of a VOC-free solder paste; and the provision of a VOC-free flux-core solder wire.

Other objects, features and advantages of the invention shall become apparent as the description thereof proceeds herein.

DESCRIPTION OF THE PREFERRED EMBODIMENT

Soldering Flux

As will hereinafter be more fully described, the instant soldering flux is based on an epoxy resin system, wherein there are no volatile organic solvents or compounds present.

The instant VOC-free soldering flux consists essentially of an activating agent, an epoxy curing agent, and a thixotropic agent blended in a mixture of a reactive epoxy resin and a non-volatile liquid epoxy diluent. No organic solvents are present in the instant soldering flux. In the instant invention, it is preferred that the activating agent also acts as the curing agent for the epoxy resin.

The reactive epoxy resin comprises the primary ingredient in the instant soldering flux consisting of about 40% to about 50% by weight of the entire flux composition. In the instant invention, reactive epoxy resins having at least two reactive epoxy groups are particularly preferred. In this connection, bisphenol A type resin has been found to be particularly suitable for the instant flux composition, although other resins having similar characteristics are also suitable. For example, epoxy novolac resins and polyglycol epoxy resins are also suitable.

Most of the above-noted epoxy resins have a viscosity (around 100 Poise) which is too high for effective use in a printable soldering flux or solder paste. According to the instant invention, the epoxy resin is blended with low molecular weight, low viscosity, non-volatile liquid epoxy diluent having a viscosity around 5 Poise to achieve a lower viscosity solution. A viscosity in the range of about 10 Poise to about 50 Poise (25° C., Brookfield) is particularly preferred for the instant soldering flux. In this regard, the non-volatile diluent preferably comprises about 25% to about 30% by weight of the entire flux composition. The epoxy diluent may comprise a reactive diluent containing one or more reactive epoxy groups, for example a low molecular weight polyol, such as polyglycol diepoxide, or an oligomer having at least one epoxy group per molecule. Other suitable reactive diluents include alkyl glycidyl ethers, and glycidyl acid esters.

Furthermore, the epoxy diluent may alternatively comprise a non-reactive diluent, for example a polyether diol with a molecular weight under 1000. However, other non-reactive diluents which are also effective include nonyl phenol, furfuryl alcohol, and dibutyl phthalate.

The blend of epoxy resin and epoxy diluent is called the epoxy resin system which comprises between about 75% to about 80% by weight of the entire soldering flux.

To further improve printability of the flux composition, a thixotropic agent, for example, hydrogenated castor oil, is preferably added to the resin system. Other suitable thixotropic agents include polyamides, and polyethylene waxes. The thixotropic agent preferably comprises about 2.5% to about 3.5% by weight of the entire flux composition.

The activating agent comprises an organic acid, preferably a polyfunctional carboxylic acid, such as malic acid, glutaric acid, succinic acid, or azelaic acid, or citric acid. A polyfunctional carboxylic acid has more than one carboxylic acid group, which means that this category comprises the dicarboxylic acids (2 carboxylic acid groups) like malic acid, glutaric acid, succinic acid, and azelaic acid, and tricarboxylic acids (3 carboxylic groups) like citric acids. All of these acids are suitable for use in soldering fluxes. The carboxylic acid may further comprise a linear dicarboxylic acid having the following general structure:

HOOC—(CH$_2$)$_n$—COOH wherein n=2 to 5.

An additional requirement of the activating agent is that it must remain in solid, i.e. unreactive form, at room temperature. There should be no reaction at all between the dispersed activating/curing agent and the epoxy resin at room temperature. The activating/curing agent must therefore be insoluble in the resin system. In this regard, the activating agents are provided in a powdered form and blended into the epoxy resin system wherein they remain suspended in powdered form until the soldering flux is heated. In this manner, the activation/curing reaction can start only after the activating/curing agent has been melted. It is pointed out that the particular epoxy resin and activating/curing agent selected are determined by the melting temperature of the solder/solder alloy to be used. The reaction starting temperature of the epoxy resin with the activating agent must be slightly lower that the melting point of the solder. For example, the reflow temperature of Sn63/Pb37 solder alloy is about 183° C. Therefore, activating agents having a melting temperature of about 130 to 180° C. can be considered. An activating/curing agent with a lower melting temperature would initiate the curing reaction to far ahead of the reflow process, while an activating agent with a higher melting temperature would start the reaction too late, resulting in the reflow process being completed before the resin system can be fully cured.

In the instant invention, it is preferred that the activating agent also act as the curing agent for the epoxy resin system. In this regard, the polyfunctional carboxylic acids described hereinabove have been found to be suitable both as an activating agent and as a curing agent. In the alternative, additional curing agents, such as triisopropanolamine, can be added to the soldering flux to catalyze the curing process. Other curing agents which are suitable include melamine, 2-amino pyrimidine, and 2,4,6-triamino pyrimidine.

The curing reaction rate of the curing agent with the epoxy resin system is a function of the number of reaction sites, i.e. functional epoxy groups, available, expressed in wt % epoxide. The standard epoxy resins described above, including bisphenol A type resin, each have a wt % epoxide of about 25. The low viscosity epoxy diluent, i.e. polyglycol diepoxide, has a wt % epoxide of about 7. Non-reactive epoxy diluents have a 0 wt % epoxide. It has been found that the resin blend must preferably have an overall wt % epoxide of about 15 to about 20, and more preferably of about 17 wt % epoxide, for the flux to work properly, i.e. to result in a dry, non-sticky, flexible residue after curing.

EXAMPLES

Flux Preparation #1

40 wt % bisphenol A type resin (molecular weight 378) (epoxide equivalent weight 189) was blended with 25 wt % polyether diol (molecular wight 760) resulting in a low viscosity epoxy resin system. 3.5 wt % hydrogenated castor oil was dispersed in the epoxy resin system at 75° C. for 15 minutes. The blend was cooled down to 40° C. and 26 wt % malic acid (fine powdered form) and 0.5 wt % triisopropanolamine (fine powdered form) were dispersed in the blend under high shear.

Flux Preparation #2

Prepared as in flux 1 using 50 wt % bisphenol type A epoxy resin, 25 wt % polyglycol diepoxide (viscosity 30–60 centipoise), 2.0 wt % hydrogenated castor oil, 20 wt % glutaric acid, and 3 wt % malic acid.

Flux Preparation #3

Prepared as in flux 2 using 50 wt % bisphenol A type epoxy resin, 25 wt % polyglycol diepoxide (viscosity 30–60 centipoise), 2 wt % hydrogenated castor oil, 20 wt % succinic acid, and 3.0 wt % malic acid.

Flux Preparation #4

Prepared as in flux 2 using 50 wt % bisphenol A type epoxy resin, 25 wt % polyglycol diepoxide, 2 wt % hydrogenated castor oil, 20 wt % azelaic acid, and 3.0 wt % malic acid.

Solder Paste

A solder paste in accordance with the instant invention comprises about 40 to about 95 wt % of powdered soldering particles and about 5 to about 60 wt % VOC-free soldering flux as described herein. The soldering particles preferably comprise tin-lead alloys, such as Sn 63/Pb 37 having a reflow temperature of about 183° C., and alternatively can comprise silver-tin-lead alloys, bismuth-tin-lead alloys, gold-tin-lead alloys, or iridium-tin-lead alloys. The soldering particles preferably have a mesh size of about 325 to about 500, although other size soldering particles are also suitable depending upon the particular application of the solder paste.

EXAMPLE

Solder Paste Preparation 130 g of soldering flux as prepared in flux preparation 2 is mixed with 870 g of solder powder Sn63/Pb37, 325–500 mesh to yield about 1 kg of solder paste.

In use, the solder paste is printed onto a printed wiring board (PWB) according to conventional printing techniques, an electronic package is placed in position over the printed areas of the PWB, and the PWB is placed in a solder reflow oven. The oven is raised to the solder reflow temperature in a typical spike curve as is well known in the art. As the temperature rises above the melting temperature of the activating agent, the activating agent melts and activates the solder and copper contact pads to remove any oxide film on the surfaces thereof. The activating agent further acts as a curing agent to begin coupling reactions of the epoxy system. When the temperature rises to the solder reflow temperature, the solder melts and reflows over the surfaces to effect a solder bond between the copper land, and the leads of the electronic package, while the epoxy system is simultaneously cured. When the reflow process is complete, the epoxy based flux dries to leave a clear, flexible residue, which does not lose any of its volume. Since there are no organic solvents or compounds, no organic materials are released into the air. The flexible, dry residue does not require cleaning, and acts as a mechanical reinforcement between the electronic package and the PWB, making the application particularly suitable for flexi-circuits. Since the residue is non-sticky. it is also particularly suitable for pin testing of the soldering joints after reflow.

Flux-Core Solder Wire

The instant VOC-free flux composition is also effective for use in a flux-core solder wire. Flux-core solder wires are typically used in manual soldering procedures wherein the solder wire is melted via a hand-held soldering iron. One problem in the industry with regard to prior art flux-core solder wires is the direct exposure of employees working with soldering irons to the toxic VOC emissions released from the rosin-based solder fluxes during manual soldering operations.

A flux-core solder wire in accordance with the instant invention comprises a wire structure having an inner core of the above-described VOC-free soldering flux, and an outer shell of a solder alloy as previously described. For example, the solder alloy preferably comprises a tin-lead alloy, such as Sn 63/Pb 37, which also has a reflow temperature of about 183° C., and alternatively can comprise silver-tin-lead alloys, bismuth-tin-lead alloys, gold-tin-lead alloys, or iridium-tin-lead alloys. Core solder wires and their manufacture have heretofore been known in the art, and therefore, the specific means of manufacture will not be further described herein.

EXAMPLE

VOC-Free Flux-Core Solder Wire

Soldering flux as prepared in flux preparation 1 (above) is co-extruded with solder alloy Sn 63/Pb 37 according to conventional manufacturing techniques to yield a flux-core solder wire having the described solder flux as the central core thereof.

It is still further contemplated that the instant VOC-free flux composition will be utilized as an underfill material in a Direct Chip Attach Package.

It can therefore be seen that the instant invention provides an effective, and environmentally friendly, VOC-free soldering flux, VOC-free solder paste, and VOC-free flux-core solder wire. The soldering flux is composed of up to 80 wt % epoxy resin system, whereas the prior art solvent based soldering fluxes comprised up to 80 wt % organic solvent. The activating/curing agent is suspended in the epoxy resin as a fine solid particle, and becomes active only after melting in the reflow process, whereas in the prior art soldering fluxes, the activating agents are dissolved in the solvent and are thus active at room temperature. The instant VOC-free soldering flux does not lose any weight after reflow heating. The epoxy system of the flux cures to leave a clear, solid, flexible residue which acts as a mechanical reinforcement between the electronic package and the PWB, whereas in the prior art soldering fluxes, the organic solvent evaporated to lose up to 80 wt % leaving a brittle residue. For these reasons, the instant invention is believed to represent a significant advancement in the art which has substantial commercial merit.

While there is shown and described herein certain specific structure embodying the invention, it will be manifest to those skilled in the art that various modifications and rearrangements of the parts may be made without departing from the spirit and scope of the underlying inventive concept and that the same is not limited to the particular forms herein shown and described except insofar as indicated by the scope of the appended claims.

I claim:

1. A VOC-free soldering flux comprising:
   40–50 weight percent of a reactive epoxy resin;
   25–35 weight percent of a non-volatile liquid epoxy diluent;
   20–35 weight percent of a soldering activating and epoxy curing agent; and
   2–3.5 weight percent of a thixotropic agent,
   the soldering flux having a viscosity of from about 10 Poise to about 50 Poise and being formulated such that, when used in combination with solder, activation, reflow, and curing of the resin occurs with no loss in weight.

2. The VOC-free soldering flux of claim 1, wherein said reactive epoxy resin has a polymer chain including at least two reactive epoxy groups.

3. The VOC-free soldering flux composition of claim 1, wherein said non-volatile liquid epoxy diluent comprises an oligomer having at least one epoxy group per molecule.

4. The VOC-free solder flux composition of claim 1, wherein said non-volatile liquid epoxy diluent comprises a low molecular weight polyol.

5. The VOC-free solder flux composition of claim 4, wherein said non-volatile liquid epoxy diluent comprises polyglycol diepoxide.

6. The VOC-free solder flux composition of claim 1, wherein said soldering activating agent comprises an organic acid.

7. The VOC-free solder flux composition of claim 6, wherein said epoxy curing agent comprises said organic acid.

8. The VOC-free solder flux composition of claim 7, wherein said organic acid comprises a polyfunctional carboxylic acid.

9. The VOC-free solder flux composition of claim 7, wherein said organic acid comprises a linear dicarboxylic acid having the following chemical structure:

wherein n=2 to 5.

10. The VOC-free solder flux composition of claim 1, formulated as a VOC-free solder paste including soldering particles.

11. The VOC-free solder paste of claim 10 wherein said soldering particles comprise between about 40% to about 95% by weight of said solder paste and said VOC-free solder flux composition comprises between about 5% to about 60% by weight of said solder paste.

12. The solder paste of claim 11 wherein said soldering particles are selected from the group consisting of: tin-lead alloys, silver-tin-lead alloys, bismuth-tin-lead alloys, gold-tin-lead alloys, and iridium-tin-lead alloys.

13. The VOC-free soldering flux of claim 1, wherein said flux is utilized as an underfill material in an electronic package.

14. The VOC-free soldering flux of claim 1, wherein said epoxy cures to leave a residue, said residue acting as a reinforcement between an electronic package and a printed wire board.

15. The VOC-free soldering flux of claim 1 wherein said activating agent remains in unreactive form at room temperature.

16. The VOC free soldering flux of claim 1 wherein said activating agent acts as said curing agent for the epoxy resin.

17. The VOC free soldering flux of claim 1 further comprising polyfunctional carboxylic acids which act as said activating agent and said curing agent.

18. The VOC free soldering flux of claim 1 wherein said curing agent is selected from the group consisting of melanine, 2-amino pyrimidine, and 2,4,6-triamine pyrimidine.

19. A VOC-free flux-core solder wire construction comprising:

an inner core of a VOC-free soldering flux; and an outer shell of a solder alloy, said VOC-free soldering flux comprising 40–50 weight percent of a reactive epoxy resin, 25–35 weight percent of a non-volatile liquid epoxy diluent, 20–35 weight percent of a soldering activating and epoxy curing agent, and 2–3.5 weight percent of a thixotropic agent, said flux having a viscosity of from about 10 to about 50 Poise and, during reflow of the solder alloy and curing, undergoing no loss in weight.

20. A VOC-free soldering flux comprising: about 75 to about 80 weight percent of an epoxy resin system and a soldering-activating/epoxy-curing agent, the soldering flux having a viscosity of from about 10 to about 50 Poise and being composed such that, under solder reflow conditions, the flux undergoes no change in weight.

21. The VOC-free soldering flux of claim 20, wherein the epoxy resin system has an overall weight percent epoxide of from about 15% to about 20%.

22. The VOC-free soldering flux of claim 21, wherein the epoxy resin system has an overall weight percent epoxide of about 17%.

23. The VOC-free soldering flux of claim 20, wherein the soldering-activating/epoxy-curing agent is suspended as an insoluble powder in the epoxy resin system, the soldering-activating/epoxy-curing agent being unreactive with the epoxy resin system at room temperature but reactive therewith at a temperature lower than but in the range of solder reflow temperature.

24. The VOC-free soldering flux of claim 20, further comprising soldering particles and being formulated as a solder paste.

25. The VOC-free soldering flux of claim 20, wherein the epoxy resin system comprises a reactive epoxy resin and a liquid epoxy diluent that is non-volatile under solder reflow conditions.

* * * * *